United States Patent
Kuramochi

(10) Patent No.: US 7,432,602 B2
(45) Date of Patent: Oct. 7, 2008

(54) SEMICONDUCTOR DEVICE

(75) Inventor: Toshiyuki Kuramochi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 261 days.

(21) Appl. No.: 11/463,724

(22) Filed: Aug. 10, 2006

(65) Prior Publication Data
US 2007/0045870 A1 Mar. 1, 2007

(30) Foreign Application Priority Data
Aug. 24, 2005 (JP) ............................... 2005-242641

(51) Int. Cl.
*H01L 23/48* (2006.01)
*H01L 23/52* (2006.01)
*H01L 29/40* (2006.01)

(52) U.S. Cl. ...................... 257/783; 257/690

(58) Field of Classification Search ................ 257/678, 257/687, 701, 702, 703, 704, 783, 784, 690
See application file for complete search history.

(56) References Cited

U.S. PATENT DOCUMENTS

| | | | | |
|---|---|---|---|---|
| 6,133,070 | A * | 10/2000 | Yagi et al. ................ | 438/121 |
| 6,614,122 | B1 * | 9/2003 | Dory et al. ................ | 257/787 |
| 6,818,989 | B2 * | 11/2004 | Higuchi et al. ............. | 257/738 |
| 6,853,089 | B2 * | 2/2005 | Ujiie et al. ................. | 257/783 |
| 6,861,747 | B2 * | 3/2005 | Miyazaki et al. ............ | 257/718 |
| 7,023,084 | B2 * | 4/2006 | Tomabechi et al. .......... | 257/720 |
| 2003/0052419 | A1 * | 3/2003 | Ujiie et al. ................. | 257/787 |

FOREIGN PATENT DOCUMENTS

| | | |
|---|---|---|
| JP | 5-183070 | 7/1993 |
| JP | 9-162208 | 6/1997 |
| JP | 2001-244384 | 9/2001 |

* cited by examiner

*Primary Examiner*—S. V Clark
(74) *Attorney, Agent, or Firm*—Rankin, Hill & Clark LLP

(57) ABSTRACT

A semiconductor device includes: a semiconductor chip connected onto a surface of a printed wiring board in a flip-chip connection; a dam for preventing an outflow of underfill, the dam being provided on the surface of the printed wiring board and surrounding an entire circumference of the semiconductor chip; an external connection terminal for the semiconductor chip, the external connection terminal being provided on the surface of the printed wiring board and arranged outside the dam; a solder resist layer covering the surface of the printed wiring board except for portions for the flip-chip connection and the external connection terminal arrangement; and at least one recess portion being provided in the solder resist layer and within a region between a corner portion of the semiconductor chip and a corner portion of the dam being opposed to the corner portion of the semiconductor chip.

4 Claims, 4 Drawing Sheets

SEMICONDUCTOR DEVICE

This application claims foreign priority based on Japanese Patent application No. 2005-242641, filed Aug. 24, 2005, the content of which is incorporated herein by reference in its entirety.

BACKGROUND OF THE INVENTION

1. Field of the Invention

The present invention relates to a semiconductor device having a semiconductor chip being connected onto a surface of a printed wiring board in a flip-chip connection.

2. Description of the Related Art

In a structure in which a semiconductor chip is connected onto a printed wiring board in a flip-chip connection, in order to ensure the reliability of a connection of the chip with the printed wiring board, a gap formed between the chip and the board is filled with an underfill (sealing resin) so as to reinforce a connection of the chip with the printed wiring board. In order to enhance the reinforcing effect, the underfill is made to overflow a little from between the chip and the board to the periphery so that the overflowed underfill is formed into a mountain-shape, the top of which is the chip and the skirt portion of which is extended from the top of the mountain-shape. However, in a case of a structure in which components are high-densely mounted on the board, another device or a wiring system, etc., is arranged very close to the chip. Therefore, it is necessary to prevent the occurrence of such a problem that an overflowing underfill widely spreads and reaches a periphery portion, which negatively affects an electric operation of the semiconductor device. Accordingly, in order to restrict an outflow range of the underfill overflowing from between the chip and the board, various proposals have been made until now.

JP-A-5-183070 and JP-A-9-162208 disclose a structure of a dam, which surrounds a semiconductor chip in a frame shape, for restricting an outflow range of the sealing resin (not referred to as an underfill), in which not the flip-chip connection but a wire bonding connection is used. Since this structure uses the wire bonding connection, as compared with the structure in which the flip-chip connection is used, sizes of the wiring board and the dam are large. However, both the chip connecting structures have a basic concept in common in which the outflow range of the resin is restricted by the dam.

In order to enhance an effect of restricting the outflow range, JP-A-5-183070 proposes a dam in which multiple layers are three-dimensionally laminated, and JP-A-9-162208 proposes a dam which is double frame shaped two-dimensionally.

In order to restrict an outflow range of the underfill in a structure in which the flip-chip connection is used, JP-A-2001-244384 makes the following three proposals: (1) A step structure in which a solder resist layer is made to be thinner for one step than an original solder resist layer, for all over the circumference of the chip from a periphery edge of a chip connecting region to a periphery region; (2) A structure in which a groove surrounding the overall circumference of a chip is formed in a solder resist layer in a periphery of a chip connecting region; and (3) A structure in which a frame-shaped dam surrounding the overall circumference of a chip is formed on a solder resist layer in a periphery of a chip connecting region.

However, an outer shape and a thickness of the semiconductor device have been recently reduced. Accordingly, components as the inner structure have been high-densely mounted and miniaturized. Therefore, it is difficult for these methods to reliably restrict an outflow range of the underfill.

FIG. 1 is a schematic illustration showing a portion of a semiconductor device 10 having a semiconductor chip 14 connected onto a printed wiring board 12 in a flip-chip connection. On a surface of the printed wiring board 12, a frame-shaped dam 16 for restricting an outflow range of the underfill surrounds an entire circumference of the semiconductor chip 14, and solder balls 18, which are external connection terminals for connecting the semiconductor chip 14 with the external circuit via a wiring pattern, are arranged outside the frame-shaped dam 16.

In the case where the solder balls 18 are arranged on a surface of the printed wiring board on the side on which the chip 14 is mounted, the solder balls 18 are arranged very close to the chip 14. Therefore, a flow of the underfill overflowing the dam 16 easily reaches the solder balls 18.

In some cases, as a customization of a basic design, the solder ball is further disposed in a portion very close to the corner of the semiconductor chip. In this case, an space between the outer edge of the semiconductor chip and the inner edge of the dam is reduced. Accordingly, there is a high possibility that a flow of the underfill overflowing from between the chip and the printed wiring board goes over the dam and overflows outside.

FIG. 2A is an enlarged view of the corner portion which is surrounded by a circle C drawn by a broken line shown in FIG. 1. As shown by the reference numeral 20 in the drawing, the underfill, which is filled in a gap between the semiconductor chip 14 and the printer wiring board 12, flows outside from a mounting region of the semiconductor chip 14. However, an outflow range of the underfill shown by a reaching front edge 20F is restricted inside the frame-shaped dam 16 surrounding the semiconductor chip 14.

FIG. 2B is a view showing a state in which customization is made in such a manner that the solder ball 18A is further disposed in the corner portion. In the corner portion, in order to ensure an area required for the further disposed solder ball 18A itself and clearance in the periphery of the solder ball 18A, the dam 16 is arranged being retreated to the semiconductor chip 14 side. Therefore, a space between the outer edge of the semiconductor chip 14 and the inner edge of the dam 16 is reduced. As a result, the front edge 20F of the underfill 20 is forcibly dammed up at a position of the dam 16 that is retreated as compared to the original reaching position 20F' shown by the broken line in the drawing. Accordingly, the underfill 20 is locally collected and raised. Consequently, there is a high possibility that the underfill 20 goes over across the dam 16 and overflows.

SUMMARY OF THE INVENTION

The present invention has been made in view of the above circumstances, and provides a semiconductor device including a semiconductor chip, which is connected onto a surface of a printed wiring board in a flip-chip connection, and also including solder balls as external connection terminals for the semiconductor chip, wherein a flow of underfill is reliably prevented from overflowing outside by a dam corner portion being opposed to a corner portion of the semiconductor chip.

In some implementations, a semiconductor device of the invention comprising:

a semiconductor chip connected onto a surface of a printed wiring board in a flip-chip connection;

a dam for preventing an outflow of underfill, the dam being provided on the surface of the printed wiring board and surrounding an entire circumference of the semiconductor chip;

an external connection terminal for the semiconductor chip, the external connection terminal being provided on the surface of the printed wiring board and arranged outside the dam;

a solder resist layer covering the surface of the printed wiring board except for portions for the flip-chip connection and the external connection terminal arrangement; and at least one recess portion being provided in the solder resist layer and within a region between a corner portion of the semiconductor chip and a corner portion of the dam being opposed to the corner portion of the semiconductor chip.

In the semiconductor device of the present invention, in a region between the corner portion of the semiconductor chip and the corner portion of the dam which is opposed to the corner portion of the semiconductor chip, a recess portion provided in the solder resist layer absorbs a flow of the underfill. Accordingly, the flow of the underfill does not overflow by going over across the dam.

DESCRIPTION OF THE PREFERRED EMBODIMENTS

Figure 1:
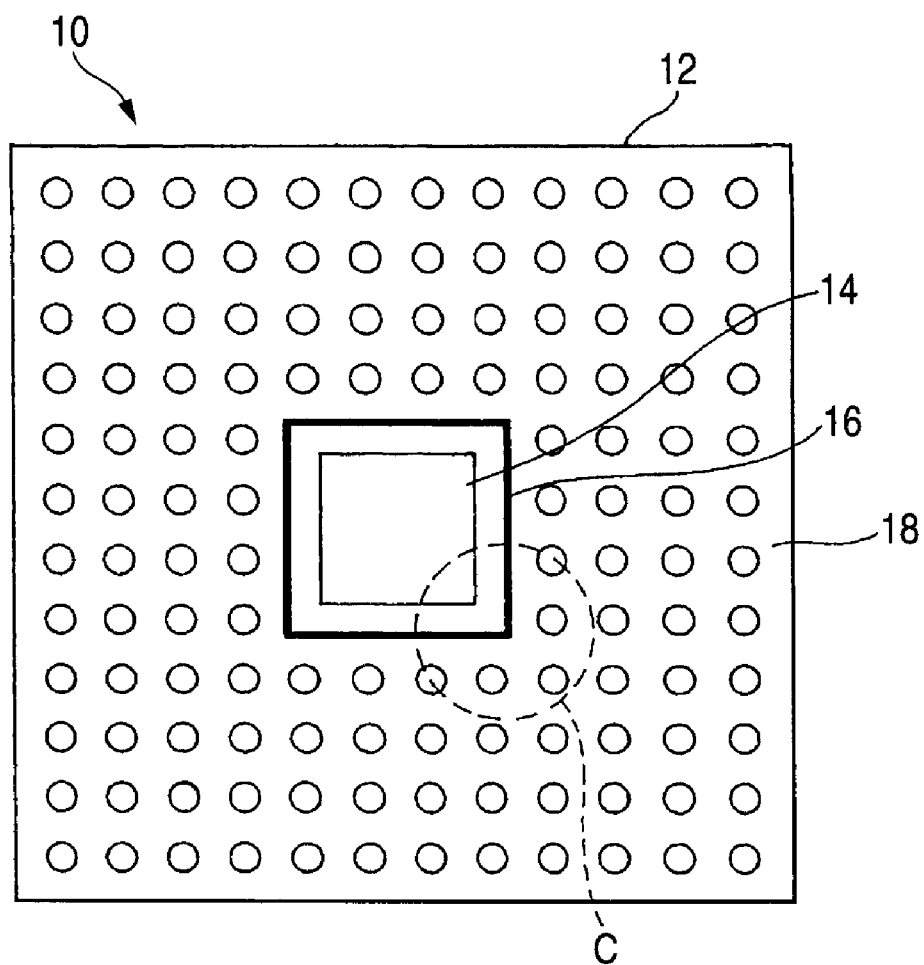
FIG. 1 is a plan view showing a related semiconductor device, wherein a semiconductor chip is connected onto the printed wiring board in a flip-chip connection.
Figure 2A:
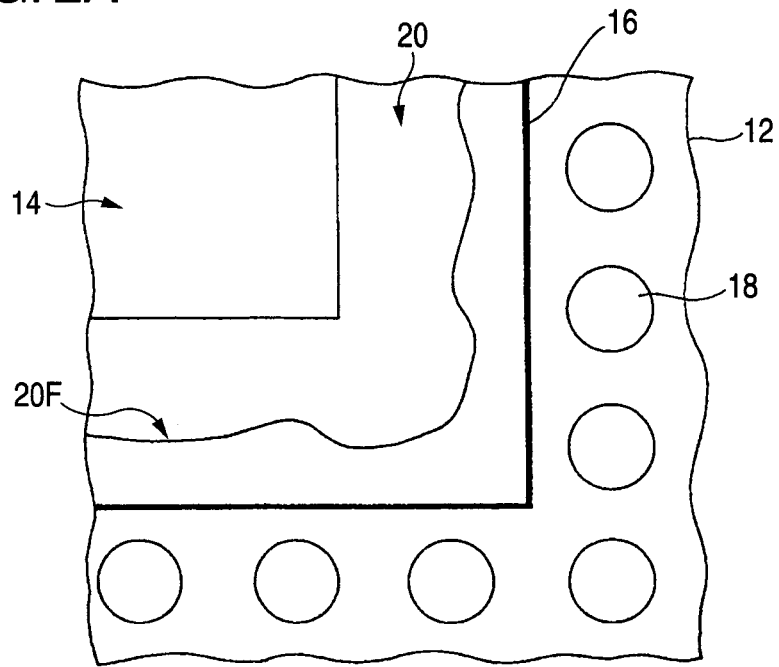
FIG. 2A is an enlarged plan view showing a neighborhood of a corner portion of a semiconductor chip in the related semiconductor device shown in FIG. 1.
Figure 2B:
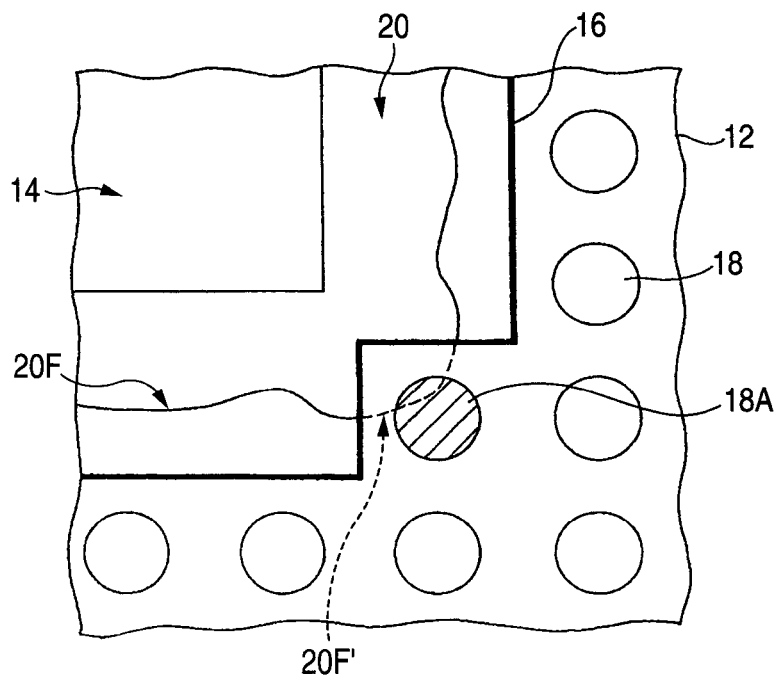
FIG. 2B is a plan view showing a state in which the solder ball is further disposed at the neighborhood of the corner portion of the semiconductor chip.
Figure 3A:
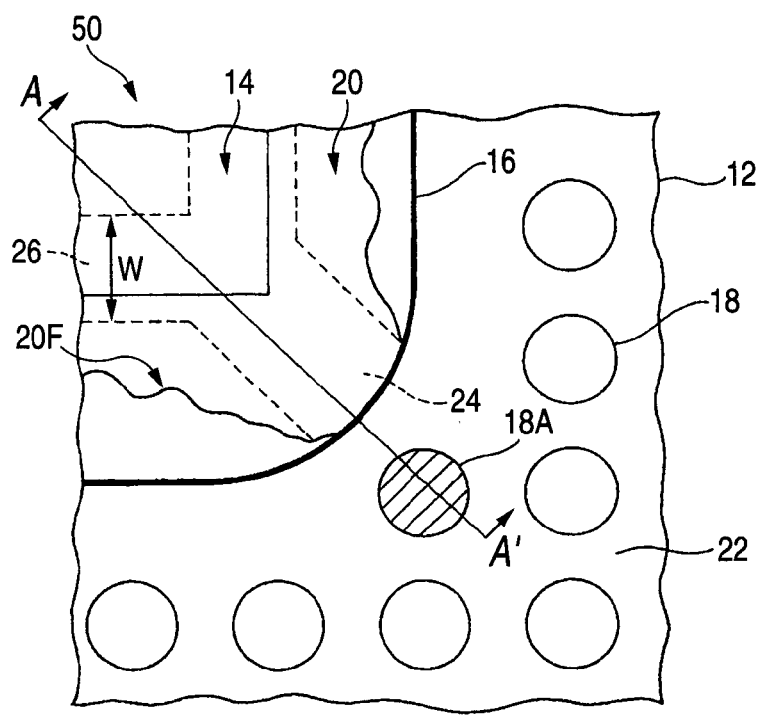
FIG. 3A is a plan view showing a neighborhood of a semiconductor chip corner portion of a semiconductor device of an embodiment of the invention.
Figure 3B:
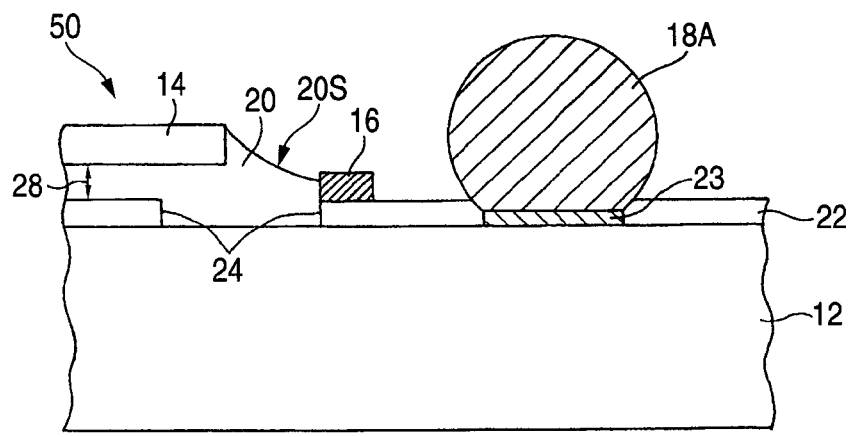
FIG. 3B is a sectional view taken on line A-A' in FIG. 3A.

FIGS. 3A and 3B are views showing a portion of the semiconductor device of an embodiment of the present invention. FIG. 3A is a plan view showing a corner portion of a flip-chip connecting region, and FIG. 3B is a sectional view taken on line A-A' in FIG. 3A.

In the semiconductor device 50 shown in the drawing, a semiconductor chip 14 is connected onto a surface of a printed wiring board 12 in a flip-chip connection.

On the surface of the printed wiring board 12, a frame-shaped dam 16 for restricting an underfill outflow range surrounds an entire circumference of the semiconductor chip 14. Outside the frame-shaped dam 16, a solder ball 18A, which is used as an external connection terminal of the semiconductor chip 14, is arranged. The surface of the printed wiring board 12 except for flip-chip connecting portions and portions where solder balls are arranged is covered with a solder resist layer 22. The solder ball 18A is attached to a pad portion 23.

A recess portion 24 is formed in the solder resist layer 22 in a region between the corner portion of the semiconductor chip 14 and the corner portion of the frame-shaped dam 16 being opposed to the corner portion of the frame-shaped dam 16. This recess portion 24 of the corner portion extends in a linearly groove-shape, from the recess portion 26 (referred to as a recess portion of a flip-chip connecting portion hereinafter) in the solder resist layer exposing the wiring pattern for the flip-chip connection, to an inner edge of the dam 16. That is, one end of the recess portion 24 of the corner portion is connected to the recess portion 26 of the flip-chip connecting portion, and the other end of the recess portion 24 of the corner portion is in contact with the inner edge of the dam 16.

An underfill resin 20 is filled into a gap 28 formed between the semiconductor chip 14 and the printed wiring board 12. Then, the underfill resin 20 overflows in a periphery of the semiconductor chip 14 and further flows outward in a region between the outer edge of the semiconductor chip 14 and the dam 16 as shown by a front edge 20F. In the corner portion, since a considerably large volume of the underfill 20 is accommodated in the recess portion 24, an upper level 20S of the underfill 20 is suppressed to be low. Therefore, the underfill 20 is sufficiently dammed up by the dam 16. Accordingly, no underfill 20 overflows by going over across the dam 16.

One example of sizes of the portions of the semiconductor device according to an embodiment of the invention will be described below for reference.

Size of the semiconductor chip 14: 9.0 to 225 mm$^2$

Thickness of the solder resist layer 22: 10 to 20 μm

Gap 28 between the semiconductor chip 14 and the board 12: 15 to 35 μm (Strictly speaking, it is a gap between the semiconductor chip 14 and the solder resist layer 22.)

Dam 16: thickness 10 to 20 μm, width 50 to 100 μm

Width W of the recess portion 26 of the flip-chip connecting portion: 300 to 500 μm In general, the dam 16 is made of the same resin as that of the solder resist layer 22 by the same manufacturing method. Therefore, the thickness of the dam 16 is 10 to 20 μm which is the same as the thickness of the solder resist layer 22. However, it should be noted that the material, the manufacturing method and the thickness of the dam 16 are not limited to the above specific embodiment.

Explanations will be made into the reason why the region, in which the recess portion for absorbing the underfill is provided, is limited to the above corner region.

In JP-A-2001-244384, a step and groove are provided on the solder resist layer on the entire circumference of the semiconductor chip. However, right under the solder resist layer, leads (a wiring pattern) from a flip-chip connection pad and lines for forming a circuit are provided. Therefore, when the step and groove are formed by removing the solder resist layer with respect to the entire circumference of the semiconductor chip, solder flows into the removed parts, at the time of reflow of the flip-chip connection. Accordingly, there is a high possibility that the phenomenon of short-circuit is caused when the exposed leads and the lines are jointed by solder. Further, there is a high possibility of occurrence of short-circuit by ion-migration of wiring Cu due to a high temperature at the time of joining by soldering. Accordingly, there is a high possibility of short-circuit. Especially, short-circuit tends to be caused by ion-migration.

In an embodiment of the present invention, in order to avoid the occurrence of the above danger of short-circuit, the region in which the recess portion in the solder resist layer is formed is limited to the corner region in which an outflow of the underfill 20 tends to occur when the solder ball is further disposed, and a region other than the corner region is left as its original state in which the initial thickness of the solder resist layer is maintained.

A two-dimensional shape of the recess portion 24 of the corner portion is not necessarily limited to the groove-shape shown in FIGS. 3A and 3B.

Examples of the two-dimensional shape of the recess portion 24 of the corner portion are shown in FIGS. 4A-4D. For the convenience of illustration, the solder balls 18, 18A are omitted in the drawing.

Figure 4A:
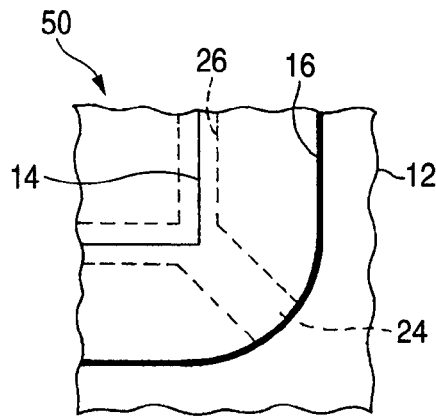
FIGS. 4A-4D are plan views showing various embodiments of a recess portion at the corner portion in the semiconductor device.

An example shown in FIG. 4A is a groove-shaped recess portion 24 of the corner portion in the two-dimensional shape, which is explained in FIGS. 3A and 3B. This recess portion 24 continuously provided from the recess portion 26 of the flip-chip connecting portion to the dam 16.

Figure 4B:
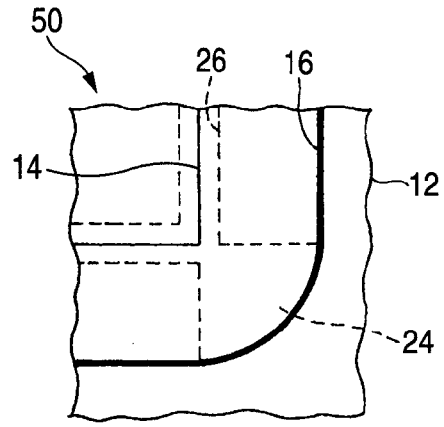

An example shown in FIG. 4B is a fan-shaped recess portion 24 in the two-dimensional shape, a pivot of the fan shape being located at a position close to the corner of the semiconductor chip 14. In this case, also, the recess portion 24 is continuously provided from the recess portion 26 of the flip-chip connecting portion to the dam 16.

Figure 4C:
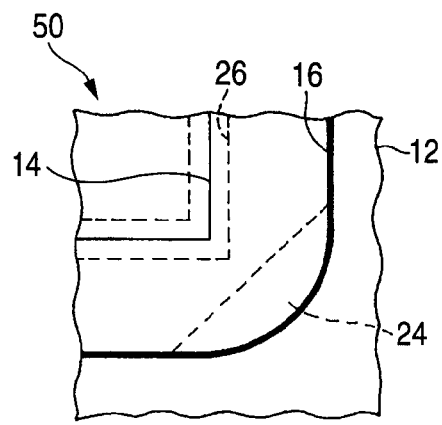

An example shown in FIG. 4C is a recess portion 24 of the corner portion in the two-dimensional shape, which is surrounded by ¼ arc of the corner of the dam 16 and a chord. In this case, the recess portion 24 is independent from the recess portion 26 of the flip-chip connecting portion and inscribed in the dam 16.

In the three examples described above, it is supposed that no wiring is provided in the corner portion of the dam 16. An example of the embodiment of the recess portion 24 in the case where the wiring is provided in the corner portion is shown below.

Figure 4D:
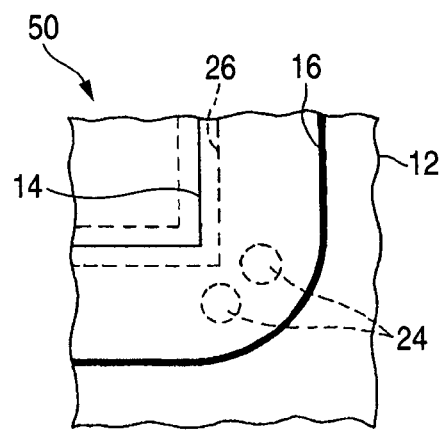

An example shown in FIG. 4D is recess portions 24 of the corner portion including two divided regions so as to avoid the wiring provided right under the corner portion. These recess portions 24 are independent from the recess portion 26 of the flip-chip connecting portion and the dam 16. Since the minimum pad pitch of the pad portion 23 (shown in FIG. 3B) for joining the solder ball is approximately 40 μm at present, the minimum L/S is approximately 20/20 μm. L/S is a ratio of the wiring width L to the wiring interval S (a ratio of line/space). Accordingly, the minimum space on the board surface is equal to or more than 20 μm. Considering the length of lead wiring, from the viewpoint of avoiding the occurrence of ion-migration, the minimum space of about 30 μm is needed. In view of the above, from the degree of freedom of design, it is sufficiently possible to provide the recess portion 24 of the corner portion while avoiding the wiring provided right under the corner portion as shown in FIG. 4D.

It should be noted an embodiment of the recess portion 24 of the corner portion is not limited to the above four examples. It is possible to adopt various embodiments including more irregular embodiments. It is possible to adopt a common embodiment with respect to all four corners. Alternatively, it is possible to adopt a different embodiment with respect to one corner or all corners.

According to the present invention, a semiconductor device is provided which includes a semiconductor chip, which is connected onto a surface of a printed wiring board in a flip-chip connection, and also includes solder balls, which are external connection terminals for the semiconductor chip, wherein when a frame-shaped dam and a corner portion ditch are both provided, an underfill can be reliably prevented from overflowing from a dam corner portion which is opposed to a corner portion of the semiconductor chip.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A semiconductor device comprising:
   a semiconductor chip connected onto a surface of a printed wiring board in a flip-chip connection;
   a dam for preventing an outflow of underfill, the dam being provided on the surface of the printed wiring board and surrounding an entire circumference of the semiconductor chip;
   an external connection terminal for the semiconductor chip, the external connection terminal being provided on the surface of the printed wiring board and arranged outside the dam;
   a solder resist layer covering the surface of the printed wiring board except for portions for the flip-chip connection and the external connection terminal arrangement; and
   at least one recess portion being provided in the solder resist layer and within a region between a corner portion of the semiconductor chip and a corner portion of the dam being opposed to the corner portion of the semiconductor chip.

2. The semiconductor device according to claim 1, wherein the external connection terminal is a solder ball.

3. The semiconductor device according to claim 1, wherein the recess portion is continuously provided from the portion for the flip-chip connection to an inner edge of the dam.

4. The semiconductor device according to claim 1, wherein the recess portion is provided so as to avoid a wiring positioned right under the region between the corner portion of the semiconductor chip and the corner portion of the dam.

* * * * *